(12) United States Patent
Zeng

(10) Patent No.: US 9,129,870 B2
(45) Date of Patent: Sep. 8, 2015

(54) PACKAGE STRUCTURE HAVING EMBEDDED ELECTRONIC COMPONENT

(71) Applicant: Unimicron Technology Corporation, Taoyuan (TW)

(72) Inventor: Zhao-Chong Zeng, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 0 days.

(21) Appl. No.: 14/314,242

(22) Filed: Jun. 25, 2014

(65) Prior Publication Data

US 2014/0306340 A1 Oct. 16, 2014

Related U.S. Application Data

(62) Division of application No. 13/352,664, filed on Jan. 18, 2012, now Pat. No. 8,884,429.

(30) Foreign Application Priority Data

Apr. 28, 2011 (TW) .............................. 100114827 A

(51) Int. Cl.
*H01L 23/52* (2006.01)
*H01L 23/00* (2006.01)
*H01L 23/13* (2006.01)
*H01L 23/538* (2006.01)
*H01L 23/498* (2006.01)

(52) U.S. Cl.
CPC ................ *H01L 24/14* (2013.01); *H01L 23/13* (2013.01); *H01L 23/5389* (2013.01); *H01L 24/19* (2013.01); *H01L 23/49816* (2013.01); *H01L 2224/12105* (2013.01); *H01L 2224/131* (2013.01); *H01L 2924/00013* (2013.01); *H01L 2924/01029* (2013.01)

(58) Field of Classification Search
None
See application file for complete search history.

(56) References Cited

U.S. PATENT DOCUMENTS

| 7,705,446 | B2 | 4/2010 | Chia et al. |
| 2004/0001324 | A1 | 1/2004 | Ho et al. |
| 2006/0043549 | A1 | 3/2006 | Hsu |
| 2011/0018123 | A1 | 1/2011 | An et al. |

FOREIGN PATENT DOCUMENTS

TW 201001662 1/2010

*Primary Examiner* — Yasser A Abdelaziez
(74) *Attorney, Agent, or Firm* — Mintz Levin Cohn Ferris Glovsky and Popeo, P.C.; Peter F. Corless; Steven M. Jensen

(57) ABSTRACT

A package structure having an embedded electronic component includes: a carrier having a cavity penetrating therethrough; a semiconductor chip received in the cavity and having solder bumps disposed thereon; a dielectric layer formed on the carrier and the semiconductor chip so as to encapsulate the solder bumps; a wiring layer formed on the dielectric layer; an insulating protection layer formed on the dielectric layer and the wiring layer; and a solder material formed in the dielectric layer and the insulating protection layer for electrically connecting the wiring layer and the solder bumps, thereby shortening the signal transmission path between the semiconductor chip and the carrier to avoid signal losses.

2 Claims, 4 Drawing Sheets

PACKAGE STRUCTURE HAVING EMBEDDED ELECTRONIC COMPONENT

CROSS-REFERENCE TO RELATED APPLICATIONS

This application is a divisional of copending application U.S. Ser. No. 13/352,664, filed on Jan. 18, 2012, which claims under 35 U.S.C. §119(a) the benefit of Taiwanese Application No. 100114827, filed Apr. 28, 2011, the entire contents of which are incorporated herein by reference.

BACKGROUND OF THE INVENTION

1. Field of the Invention

The present invention relates to package structures, and more particularly, to a package structure having an embedded electronic component and a fabrication method thereof.

2. Description of Related Art

Along with the progress of semiconductor packaging technologies, various package types have been developed for semiconductor devices so as to meet demands for highly integrated and minimized package structures. For example, wire-bonding packages or flip-chip packages allow semiconductor chips to be electrically connected to lead frames through gold wires or electrically connected to packaging substrates through solder bumps.

FIG. 1 is a cross-sectional view of a conventional flip-chip package structure. The package structure 1 has a packaging substrate 10 having a chip-mounting surface 10a with solder bumps 100 disposed thereon and a ball-mounting surface 10b opposite to the chip-mounting surface 10a, a semiconductor chip 11 mounted on the solder bumps 100 of the packaging substrate 10 through a plurality of tin balls 110, and a plurality of solder balls 16 mounted on the ball-mounting surface 10b of the packaging substrate 10.

However, since the circuit of the packaging substrate 10 has a small size, the pitch of the tin balls 110 of the chip 11 cannot be reduced. As such, the package structure 1 cannot meet the miniaturization requirement.

Further, the solder bumps 100 of the packaging substrate 10 and the tin balls 110 of the chip 11 result in a too long signal transmission path between the chip 11 and the packaging substrate 10 and cause the signal transmission path to pass through different media (the solder bumps 100 and the tin balls 110), thereby easily resulting in signal losses.

Therefore, there is a need to provide a package structure and a fabrication method thereof so as to overcome the above-described drawbacks.

SUMMARY OF THE INVENTION

In view of the above-described drawbacks, the present invention provides a package structure having an embedded electronic component, which comprises: a carrier having a cavity penetrating therethrough and a metal layer disposed at one side of the carrier for covering one end of the cavity; a semiconductor chip having opposite active and non-active surfaces and received in the cavity of the carrier with its non-active surface attached to the metal layer, wherein the active surface of the semiconductor chip has a plurality of electrode pads formed thereon, and each of the electrode pads has a solder bump disposed thereon; a dielectric layer formed on the carrier and the semiconductor chip so as to encapsulate the solder bumps and fill up the spacing between the semiconductor chip and the cavity of the carrier, wherein the dielectric layer has a plurality of through holes formed therein for exposing the solder bumps, respectively; a wiring layer formed on the dielectric layer and having a plurality of conductive pads; an insulating protection layer formed on the dielectric layer and the wiring layer and having a plurality of first openings formed therein and communicating with the through holes of the dielectric layer for exposing the solder bumps; and a solder material filled in the first openings and the through holes for electrically connecting the wiring layer and the solder bumps.

In the above-described semiconductor package, the insulating protection layer has a plurality of second openings for exposing the conductive pads, respectively, so as for a plurality of solder balls to be disposed thereon.

The present invention further provides a package structure having an embedded electronic component, which comprises: a carrier having a cavity penetrating therethrough and a metal layer disposed at one side of the carrier for covering one end of the cavity; a semiconductor chip having opposite active and non-active surfaces and received in the cavity of the carrier with its non-active surface attached to the metal layer, wherein the active surface of the semiconductor chip has a plurality of electrode pads formed thereon, and each of the electrode pads has a solder bump disposed thereon; a dielectric layer formed on the carrier and the semiconductor chip so as to encapsulate the solder bumps and fill up the spacing between the semiconductor chip and the cavity of the carrier; a wiring layer formed on the dielectric layer and having a plurality of conductive pads and a plurality of conductive vias formed in the dielectric layer for electrically connecting the solder bumps; and an insulating protection layer formed on the dielectric layer and the wiring layer and having a plurality of openings disposed therein for exposing the conductive pads.

In the above-described two package structures, the metal layer is a copper layer.

The present invention further provides a fabrication method of a package structure having an embedded electronic component, which comprises the steps of: providing a carrier having a cavity penetrating therethrough and a metal layer disposed at one side thereof for covering one end of the cavity; disposing a semiconductor chip having opposite active and non-active surfaces, in the cavity of the carrier with the non-active surface of the semiconductor chip attached to the metal layer of the carrier, wherein the active surface of the semiconductor chip has a plurality of electrode pads formed thereon, and each of the electrode pads has a solder bump disposed thereon; forming a dielectric layer on the carrier and the semiconductor chip so as to encapsulate the solder bumps and fill up the spacing between the semiconductor chip and the cavity of the carrier; forming on the dielectric layer a wiring layer having a plurality of conductive pads; forming a plurality of through holes in the dielectric layer for exposing the solder bumps, respectively, allowing an end of each of the through holes connecting the wiring layer; forming an insulating protection layer on the dielectric layer and the wiring layer, wherein the insulating protection layer has a plurality of first openings formed therein for communicating with the through holes of the dielectric layer, thereby exposing the solder bumps; and filling a solder material in the first openings of the insulating protection layer and the through holes of the dielectric layer for electrically connecting the wiring layer and the solder bumps.

The present invention provides another fabrication method of a package structure having an embedded electronic component, which comprises the steps of: providing a carrier having a cavity penetrating therethrough and a metal layer disposed at one side thereof for covering one end of the cavity; disposing a semiconductor chip having opposite active and non-active surfaces in the cavity of the carrier with the non-active surface of the semiconductor chip attached to the metal layer of the carrier, wherein the active surface of the semiconductor chip has a plurality of electrode pads formed thereon, and each of the electrode pads has a solder bump disposed thereon; forming a dielectric layer on the carrier and the semiconductor chip so as to encapsulate the solder bumps and fill up the spacing between the semiconductor chip and the cavity of the carrier; forming a plurality of vias in the dielectric layer for exposing the solder bumps, respectively; forming on the dielectric layer a wiring layer having a plurality of conductive pads, and forming conductive vias in the vias for electrically connecting the wiring layer and the solder bumps; forming an insulating protection layer on the dielectric layer and the wiring layer, wherein the insulating protection layer has a plurality of openings formed therein for exposing the conductive pads; and mounting a plurality of solder balls on the conductive pads, respectively.

According to the present invention, the semiconductor chip is received in the cavity of the carrier and the solder material or conductive vias can be used for electrically connecting the wiring layer and the semiconductor chip such that the signal transmission path between the semiconductor chip and the carrier is shortened and only passes through one medium, thereby avoiding signal losses.

Further, since the semiconductor chip is embedded in the carrier, the pitch of the conductive vias or the solder material can be matched to the pitch of the solder bumps so as to allow the pitch of the solder bumps as well as the pitch of the wiring layer to be reduced according to requirements, thereby meeting the miniaturization requirement.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms such as 'up', 'down', 'a' etc. are only used as a matter of descriptive convenience and not intended to have any other significance or provide limitations for the present invention.

FIGS. 2A to 2G are cross-sectional views showing a fabrication method of a package structure having an embedded electronic component according to the present invention.

Figure 1:
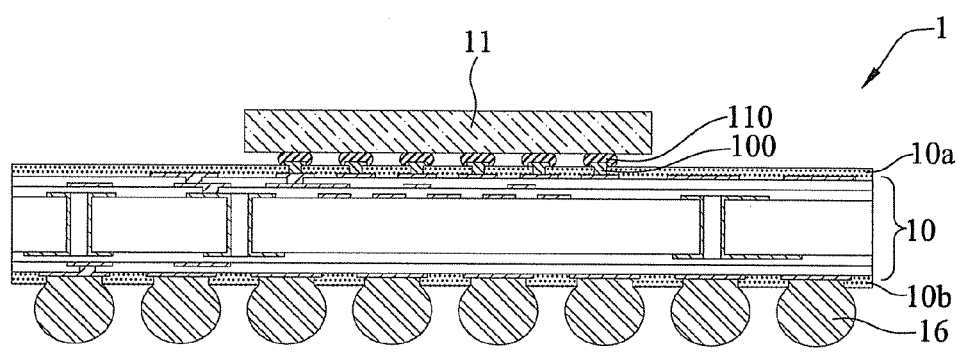
FIG. 1 is a cross-sectional view of a conventional flip-chip package structure.
Figure 2A:
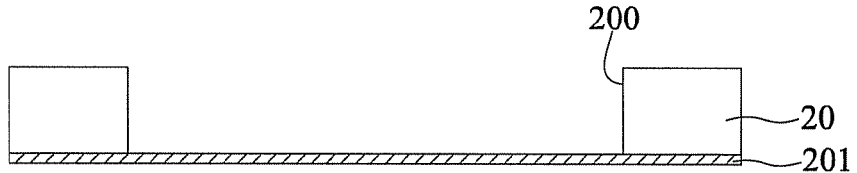
FIGS. 2A to 2G are cross-sectional views showing a fabrication method of a package structure having an embedded electronic component according to the present invention, wherein FIGS. 2F' and 2G' show another embodiment of FIGS. 2F and 2G.

Referring to FIG. 2A, a carrier 20 having a cavity 200 penetrating therethrough is provided. The carrier 20 further has a metal layer 201 disposed at one side thereof for covering one end of the cavity 200. In the present embodiment, the carrier 20 is a copper-clad substrate, and the metal layer 201 is a copper layer.

Figure 2B:
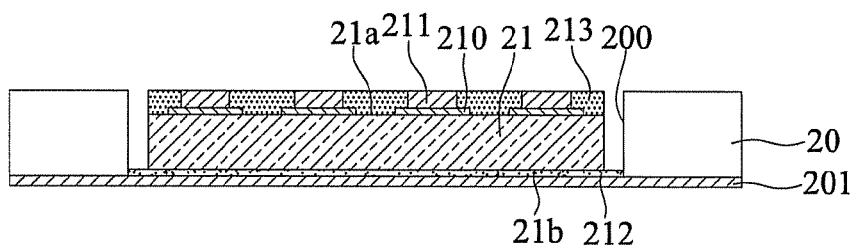

Referring to FIG. 2B, a semiconductor chip 21 having an active surface 21a and a non-active surface 21b opposite to the active surface 21a is provided. The active surface 21a of the semiconductor chip 21 has a plurality of electrode pads 210 formed thereon, and each of the electrode pads 210 has a solder bump 211 disposed thereon. The semiconductor chip 21 is received in the cavity 200 with its non-active surface 21b attached to the metal layer 201 through an adhesive layer 212. In the present embodiment, a protection layer 213 is coated on the active surface 21a of the semiconductor chip 21 so as to cover the electrode pads 210 and be flush with the solder bumps 211.

Figure 2C:
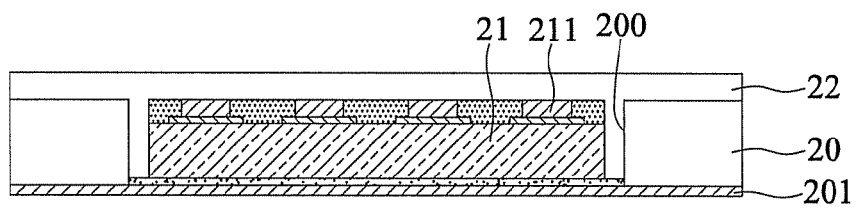

Referring to FIG. 2C, a dielectric layer 22 is formed on the carrier 20 and the semiconductor chip 21 so as to encapsulate the solder bumps 211 and fill the spacing between the chip 21 and the cavity 200 of the carrier 20.

Figure 2D:
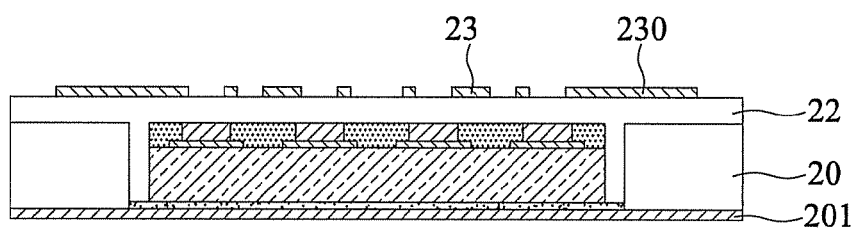

Referring to FIG. 2D, a copper layer is deposited on the dielectric layer 22 and further patterned to form a wiring layer 23 having a plurality of conductive pads 230.

Figure 2E:
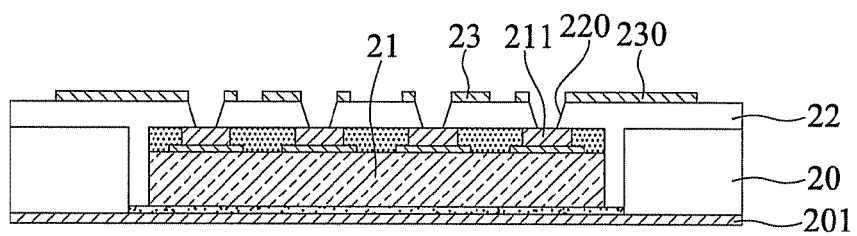

Referring to FIG. 2E, a plurality of through holes 220 are formed in the dielectric layer 22 by laser drilling so as to expose the solder bumps 211, respectively. The ends of the through holes 220 connect the wiring layer 23.

Figure 2F:
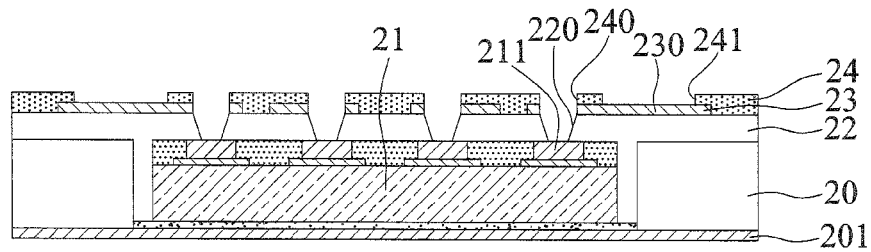

Referring to FIG. 2F, an insulating protection layer 24 is formed on the dielectric layer 22 and the wiring layer 23, and has a plurality of first openings 240 formed therein and communicating with the through holes 220 so as to expose the solder bumps 211, respectively. In the present embodiment, the insulating protection layer 24 further has a plurality of second openings 241 formed therein for exposing the conductive pads 230, respectively.

Figure 2G:
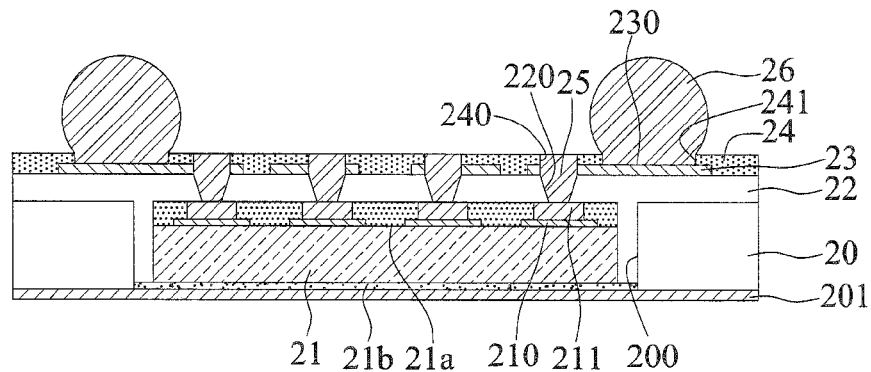
Figure 2F:
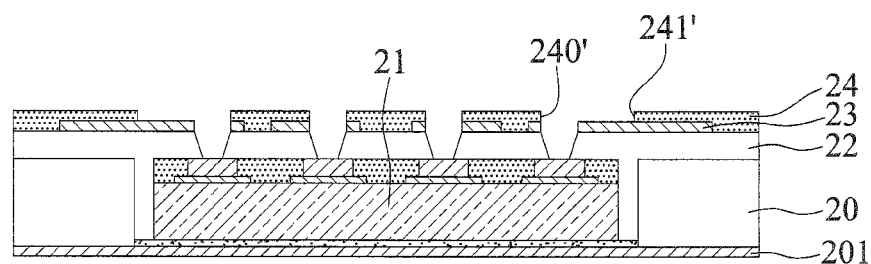
Figure 2G:
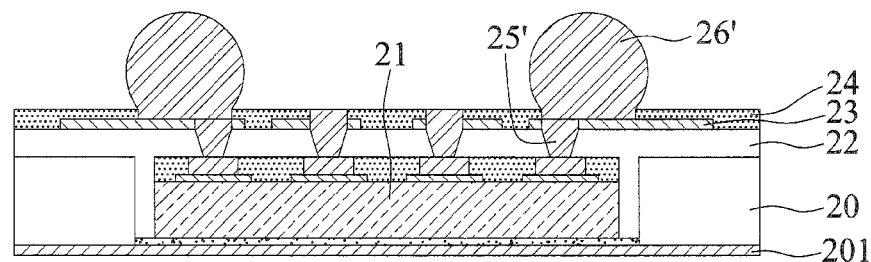

Referring to FIG. 2G, a solder material 25 is formed in the first openings 240 and the through holes 220 for electrically connecting the wiring layer 23 and the solder bumps 211. Further, a plurality of solder balls 26 are mounted on the conductive pads 230, respectively.

Referring to FIGS. 2F' and 2G', the first openings 240' can be in communication with the second openings 241' so as for the solder balls 26' to come into contact with the solder material 25'.

According to the fabrication method of the present invention, the semiconductor chip 21 is received in the cavity 200 of the carrier 20 first and then the wiring layer 23 is formed. Subsequently, the solder material 25 is formed to electrically connect the wiring layer 23 and the solder bumps 211. As such, the signal transmission path between the semiconductor chip 21 and the carrier 20 is shortened and only passes through one medium (the solder material 25), thereby avoiding signal losses.

Further, since the chip 21 is embedded in the carrier 20, the pitch of the through holes 220 can be matched to the pitch of the solder bumps 211 so as to allow the pitch of the solder bumps 211 to be reduced according to requirements. Accordingly, the size of the semiconductor chip 21 can become thinner and smaller to meet the miniaturization requirement.

Furthermore, the pitch of the wiring layer 23 can also be reduced.

Figure 3A:
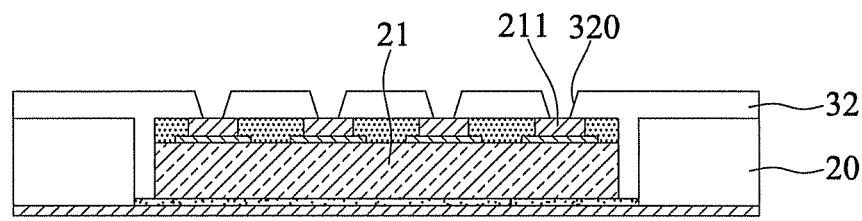
FIGS. 3A to 3C are cross-sectional views showing a fabrication method of a package structure having an embedded electronic component according to another embodiment of the present invention.
Figure 3B:
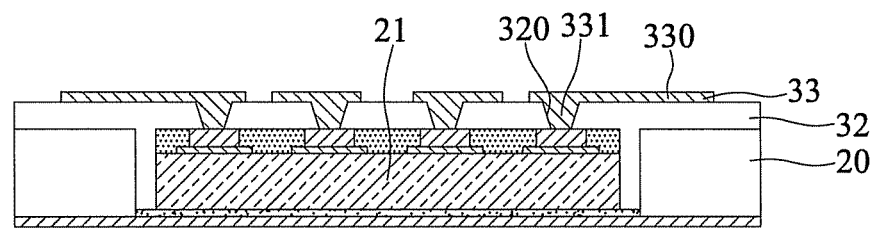
Figure 3C:
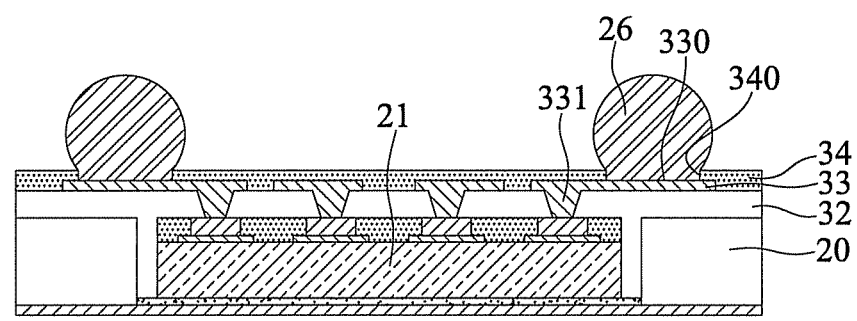

FIGS. 3A to 3C are cross-sectional views showing a fabrication method of a package structure having an embedded electronic component according to another embodiment of the present invention. The present embodiment is continued from the process of FIG. 2C. The difference of the present embodiment from the above-described embodiment is the connection between the solder bumps and the wiring layer, which is detailed as follows.

Referring to FIG. 3A, a plurality of vias 320 are formed in the dielectric layer 32 for exposing the solder bumps 211 of the semiconductor chip 21, respectively.

Referring to FIG. 3B, a wiring layer 33 having a plurality of conductive pads 330 is formed on the dielectric layer 32, and conductive vias 331 are formed in the vias 320 for electrically connecting the wiring layer 33 and the solder bumps 211.

Referring to FIG. 3C, an insulating protection layer 34 is formed on the dielectric layer 32 and the wiring layer 33, and has a plurality of openings 340 formed therein for exposing the conductive pads 330. Further, a plurality of solder balls 26 are mounted on the conductive pads 330, respectively.

According to the fabrication method of the present invention, the conductive vias 331 electrically connect the wiring layer 33 and the solder bumps 211 such that the signal transmission path between the semiconductor chip 21 and the carrier 20 is shortened and only passes through one medium (the conductive vias 331), thereby avoiding signal losses.

Further, the wiring layer 33 and the conductive vias 331 can be made of the same material such as copper so as to reduce the use of the solder material and save the fabrication cost.

According to the present invention, the wiring layer and the semiconductor chip can be electrically connected through the solder material or conductive vias so as to shorten the signal transmission path between the semiconductor chip and the carrier, thereby avoiding signal losses.

Furthermore, since the chip is embedded in the carrier, the pitch of the conductive vias or the solder material can be matched to the pitch of the solder bumps so as to allow the pitch of the solder bumps to be reduced according to requirements, thereby meeting the miniaturization requirement.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A package structure having an embedded electronic component, comprising:
    a carrier having a cavity penetrating therethrough and a metal layer disposed at one side of the carrier for covering one end of the cavity;
    a semiconductor chip having opposite active and non-active surfaces and received in the cavity of the carrier with its non-active surface attached to the metal layer, wherein the active surface of the semiconductor chip has a plurality of electrode pads formed thereon, and each of the electrode pads has a solder bump disposed thereon;
    a dielectric layer formed on the carrier and the semiconductor chip for encapsulating the solder bumps and filling up a spacing between the semiconductor chip and the cavity of the carrier;
    a wiring layer formed on the dielectric layer and having a plurality of conductive pads and a plurality of conductive vias formed in the dielectric layer for electrically connecting the solder bumps; and
    an insulating protection layer formed on the dielectric layer and the wiring layer and having a plurality of openings formed therein for exposing the conductive pads.

2. The structure of claim 1, wherein the metal layer is a copper layer.

* * * * *